(12) United States Patent  
Kamura et al.

(10) Patent No.: US 8,178,871 B2  
(45) Date of Patent: May 15, 2012

(54) ORGANIC TRANSISTOR AND METHOD FOR PRODUCING THE SAME

(75) Inventors: Masakazu Kamura, Osaka (JP); Shigeru Aomori, Osaka (JP); Yasutaka Kuzumoto, Osaka (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 190 days.

(21) Appl. No.: 12/680,413

(22) PCT Filed: Sep. 19, 2008

(86) PCT No.: PCT/JP2008/067004  
§ 371 (c)(1),  
(2), (4) Date: Mar. 26, 2010

(87) PCT Pub. No.: WO2009/041365  
PCT Pub. Date: Apr. 2, 2009

(65) Prior Publication Data  
US 2010/0237337 A1   Sep. 23, 2010

(30) Foreign Application Priority Data  
Sep. 27, 2007  (JP) ................. 2007-251838

(51) Int. Cl.  
*H01L 29/08* (2006.01)

(52) U.S. Cl. ............. 257/40; 257/51.006; 257/51.024; 438/99

(58) Field of Classification Search ............ 257/40, 257/E51.006, E51.024; 438/99  
See application file for complete search history.

(56) References Cited

U.S. PATENT DOCUMENTS

| | | | |
|---|---|---|---|
| 7,202,547 B2 | 4/2007 | Klauk et al. | |
| 2007/0221914 A1 | 9/2007 | Becker et al. | |

FOREIGN PATENT DOCUMENTS

| | | |
|---|---|---|
| JP | 3-299710 A | 10/1991 |
| JP | 2003-92411 A | 3/2003 |
| JP | 2003-258260 A | 9/2003 |
| JP | 2004-103547 A | 4/2004 |
| JP | 4260508 B2 | 4/2009 |
| WO | WO 2005/109539 A1 | 11/2005 |

OTHER PUBLICATIONS

Halik et al., "Low-voltage organic transistors with an amorphous molecular gate dielectric", Nature, Oct. 21, 2004, vol. 431, pp. 963-966.  
Steudel et al., "Influence of the dielectric roughness on the performance of pentacene transistors", Applied Physics Letters, Nov. 8, 2004, vol. 85, No. 19, pp. 4400.  
Yoon et al., "{sigma}-{pi} Molecular dielectric multilayers for low-voltage organic thin-film transistors", PNAS, Mar. 29, 2005, vol. 102, No. 13, pp. 4678-4682.  
International Search Report, dated Nov. 5, 2008.

*Primary Examiner* — Tan N Tran  
(74) *Attorney, Agent, or Firm* — Birch, Stewart, Kolasch & Birch, LLP

(57) ABSTRACT

An organic transistor comprising: at least a gate electrode and a gate insulating layer formed on the gate electrode, the gate insulating layer including, on a surface of the gate electrode, a stacked molecular film composed of a first organic molecular layer binding in a direction substantially perpendicular to the surface of the gate electrode through a first covalent bond and a second organic molecular layer binding to an unreacted end of the first organic molecular layer through a second covalent bond, wherein the second covalent bond and another second covalent bond adjacent to each other form a hydrogen bond in a direction of a surface perpendicular to a major axis direction of the stacked molecule.

12 Claims, 6 Drawing Sheets

FIG. 2-1
a)
b)
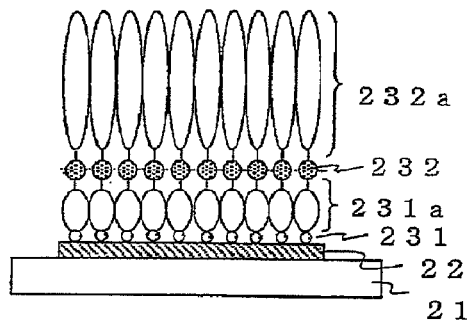
c)
e)
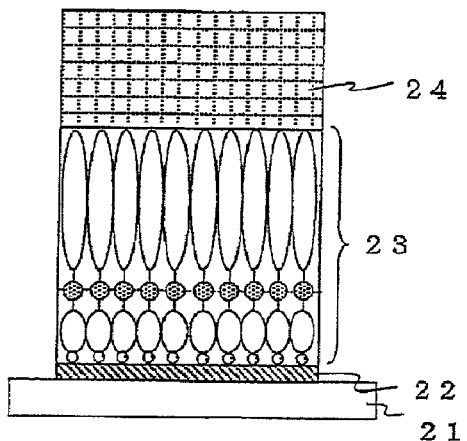
f)
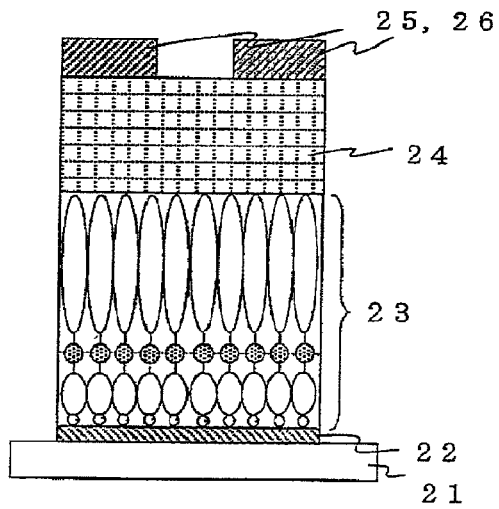
d)
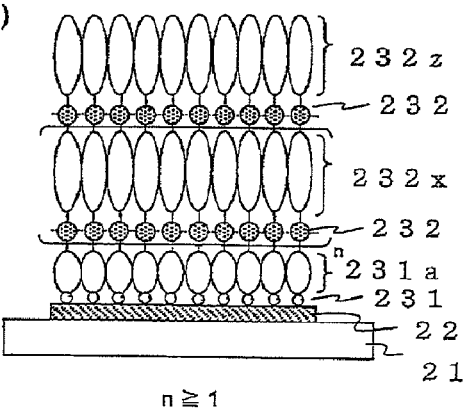
n ≧ 1

ORGANIC TRANSISTOR AND METHOD FOR PRODUCING THE SAME

TECHNICAL FIELD

The present invention relates to a field effect transistor (hereinafter, referred to as organic transistor) using an organic compound. More particularly, the present invention relates to an organic transistor that can be driven at a low voltage.

BACKGROUND ART

In recent years, organic transistors have attracted attention as a next-generation device to be an alternative to transistors of inorganic semiconductors such as silicon.

As for the organic transistors, the devices can be produced at a lower temperature of 200° C. or less compared with the silicon semiconductor production process. Also, the organic transistor devices can be produced in a liquid-phase process that does not need a vacuum such as a printing method including inkjet and a spin coat method by dissolving an organic compound. Therefore, the devices can be produced on a plastic substrate and are expected to be applied to flexible devices such as electronic papers and electronic tags. Furthermore, the organic transistors are advantageous in that facilitation of production steps, reduction of production costs, and enlargement of a substrate size are easy, because the devices can be produced at a low temperature and normal pressure.

Meanwhile, the organic transistors are characterized in that pentacene is used for a semiconductor layer and have better properties than those of amorphous silicon, showing a mobility of approximately 1 cm²/Vs. However, inorganic oxides such as a silicone oxide film or polymer materials such as polyimide (film thickness: approximately 100 nm to 300 nm) are generally used for their gate insulating layers, and the driving voltage is as high as 20 V to 100 V. With such a high driving voltage, damage to the organic compound and increase of electric power consumption are concerned, and therefore actual use is difficult.

Now, it is necessary to reduce the threshold voltage of the transistor in order to realize driving at a low voltage.

In a field effect transistor (FET) of a metal, metal oxide layer and semiconductor structure (so-called MOS structure), the threshold voltage $V_{th}$ can be represented by Formula (1).

[Formula 1]

$$|V_{th}| = V_i + \phi_s \qquad (1)$$
$$= \frac{\sqrt{2\varepsilon_o \varepsilon_s q N(2\phi_B)}}{C_i} + 2\phi_B$$

wherein, $V_i$ is a voltage to be applied to a gate insulating layer, $\phi_s$ is a semiconductor surface potential, $\varepsilon_o$ is a vacuum dielectric constant, $\varepsilon_s$ is a relative dielectric constant of a semiconductor layer, q is an electric charge, N is a carrier concentration, $\phi_B$ is a difference between an intrinsic level and a Fermi level in the semiconductor layer, and $C_i$ is a capacitance of the gate insulating layer.

Formula 1 indicates that the threshold voltage can be reduced by increasing the capacitance $C_i$ of the gate insulating layer.

Furthermore, the capacitance of the gate insulating layer can be represented by Formula 2.

[Formula 2]

$$C_i = \frac{\varepsilon_0 \varepsilon_r}{d} \qquad (2)$$

wherein, $C_i$ and $\varepsilon_0$ are as defined in Formula (1), d is a thickness of the gate insulating layer, and $\varepsilon_r$ is a relative dielectric constant of the gate insulating layer.

That is, it is important to increase the relative dielectric constant $\varepsilon_r$ of the gate insulating layer or to decrease the film thickness d of the gate insulating layer in order to reduce the capacitance of the gate insulating layer and realize driving at a low threshold voltage.

Examples of an attempt to increase the relative dielectric constant of the gate insulating layer include Patent Document 1. Generally, however, many of materials having a higher relative dielectric constant are inorganic oxides, and it is necessary to use a conventional silicon semiconductor process when films of such inorganic oxides are formed. Therefore, production at a low temperature and without the use of a vacuum process is difficult.

On the other hand, examples of an attempt to decrease the film thickness of the gate insulating layer include Non-Patent Documents 1 to 3. They all use a self-assembled layer of an organic molecule having a film thickness of approximately several nanometers, which is almost equal to the molecular length when the molecule is standing, allowing low voltage driving at an absolute value of the threshold voltage of 2 V or less and a driving voltage of 5 V or less. In addition, the self-assembled layer is advantageous also in that it allows production at a high temperature and without the use of a vacuum process.

Examples of another attempt to improve luminous efficiency of an organic light emitting diode using an organic molecule and extend its lifetime include Patent Document 2.

Patent Document 1: Japanese Unexamined Patent Publication No. 2003-25820
Patent document 2: Japanese Unexamined Patent Publication No. 2004-103547
Non-Patent Document 1: "Nature", vol. 431, p.p. 963-966, 2004, Marcus Halik et al.
Non-Patent Document 2: "PNAS", vol. 102, No. 13, p.p. 4678-4682, 2005, Myung-Han Yoon et al.
Non-Patent Document 3: "Applied Physics Letter", vol. 85, p.p. 4400, 2004, Soeren Steudel et al.

DISCLOSURE OF THE INVENTION

Problems to be Solved by the Invention

However, the gate insulating layer disclosed in Non-Patent Document 1 is formed of a self-assembled monolayer of a molecule having a long-chain alkyl group as a main chain backbone, and neighboring molecules are arranged by weak van der Waals forces. Therefore, interaction among the molecules in a plane perpendicular to a major axis direction of the molecules is weak, and pinholes are likely to form.

On the other hand, Non-Patent Document 2 discloses a stacked molecular film composed of a molecular layer of an alkyl backbone, a high-polarizability molecular layer, and a capping layer in which a plane that is perpendicular to a major axis direction of the molecule is crosslinked with a siloxane bond. In this case, the film has a structure in which in-plane strength is improved and pinholes are unlikely to form because of the crosslinking with the siloxane bond.

However, a reagent used for the formation of the capping layer is a compound containing many chlorosilyl groups, and handling thereof is difficult due to its water-prohibitive property. In addition, actual use was difficult, because corrosion of electrode materials and the stacked molecular film due to by-product hydrochloric acid produced during the formation of the capping layer was concerned.

Means for Solving the Problems

Thus, the present invention provides an organic transistor comprising: at least a gate electrode and a gate insulating layer formed on the gate electrode, the gate insulating layer including, on a surface of the gate electrode, a stacked molecular film composed of a first organic molecular layer binding in a direction substantially perpendicular to the surface of the gate electrode through a first covalent bond with one end of a first organic molecule and a second organic molecular layer binding to another end of the first organic molecular layer through a second covalent bond with one end of a second organic molecule, wherein the second covalent bond and another second covalent bond adjacent to each other form a hydrogen bond in a direction of a plane perpendicular to a stacking direction of the stacked molecular film.

The present invention also provides a method for producing an organic transistor, the method comprising:

a first step of forming a first organic molecular layer on a surface of a gate electrode in a direction substantially perpendicular to the surface of the gate electrode through a first covalent bond with one end of a first organic molecule;

a second step of forming a second organic molecular layer at another end of the first organic molecular layer through a second covalent bond with one end of a second organic molecule, and forming a gate insulating layer formed of a stacked molecular film composed of the first organic molecular layer and the second organic molecular layer; and a third step of causing the second covalent bond and another second covalent bond adjacent to each other to form a hydrogen bond in a direction of a plane perpendicular to a stacking direction of the stacked molecular film.

Effects of the Invention

According to the structure of the organic transistor of the present invention and the method for producing the same, the second covalent bond and another second covalent bond adjacent to each other form a hydrogen bond in the direction of the plane perpendicular to the stacking direction of the stacked molecular film, that is, a direction approximately parallel to the surface of the gate electrode, thereby allowing production of a gate insulating layer under a mild condition, in which the interaction between neighboring molecules is strengthened and pinholes are unlikely to form.

In addition, by stacking two or more layers consisting of second organic molecular layers, the area of the hydrogen bond formed between the second covalent bonds adjacent to each other is increased in the stacking direction of the stacked molecular film, allowing further reduction of pinholes.

In addition, when the first organic molecular layer is composed of an aromatic ring, that is, a benzene backbone, it is possible to stack a molecular layer having a molecular structure that is upright in a substantially vertical direction with respect to the gate electrode.

In addition, when the second organic molecular layer is composed of a backbone having alkane as a main chain, the mobility of electrons is lowered by a sigma bond of the main alkyl chain and the insulating property of the molecular layer itself is improved to the stacking direction of the molecular layer.

In addition, when the end group at a side opposite to the gate electrode of the stacked molecular film is a phenyl group or a methyl group, arrangement of the organic molecules of the surface of the gate insulating layer, that is, the organic semiconductor layer contacting with the end group at the side opposite to the gate electrode of the stacked molecular film is improved by the hydrophobic surface of the phenyl group or the methyl group, allowing enhancement of the carrier mobility of the organic semiconductor layer.

In addition, when the first covalent bond is a siloxane bond, the first organic molecular layer is composed of a benzene backbone, the second covalent bond is an amide bond, and the second organic molecular layer has a backbone having alkane as the main chain, it is possible to obtain an insulating layer in which the molecular density in the stacked film is higher and flatness of an upper surface of the gate insulating film formed is higher.

In addition, when the first organic molecular layer is composed of a benzene backbone, the second covalent bond is an amide bond, and the second organic molecular layer is composed of an alkyl backbone having a phenyl group at a termination of the molecule, it is possible to obtain an insulating layer having a higher molecular density in the film and a semiconductor layer in which carrier the mobility of the organic semiconductor layer contacting with the insulating layer is enhanced.

When the second covalent bond is formed through a reaction in any of the combinations of an amino group and a carboxy group, an amino group and an isocyanate group, and a hydroxy group and an isocyanate group, it is possible to produce a hydrogen bond in the direction of the plane perpendicular to the major axis direction of the molecule under a mild condition without generating a by-product that has an adverse effect on a substrate, the gate electrode, and the stacked molecular film, and strengthen the interaction between molecules.

DESCRIPTION OF THE REFERENCE NUMERALS

Figure 1:
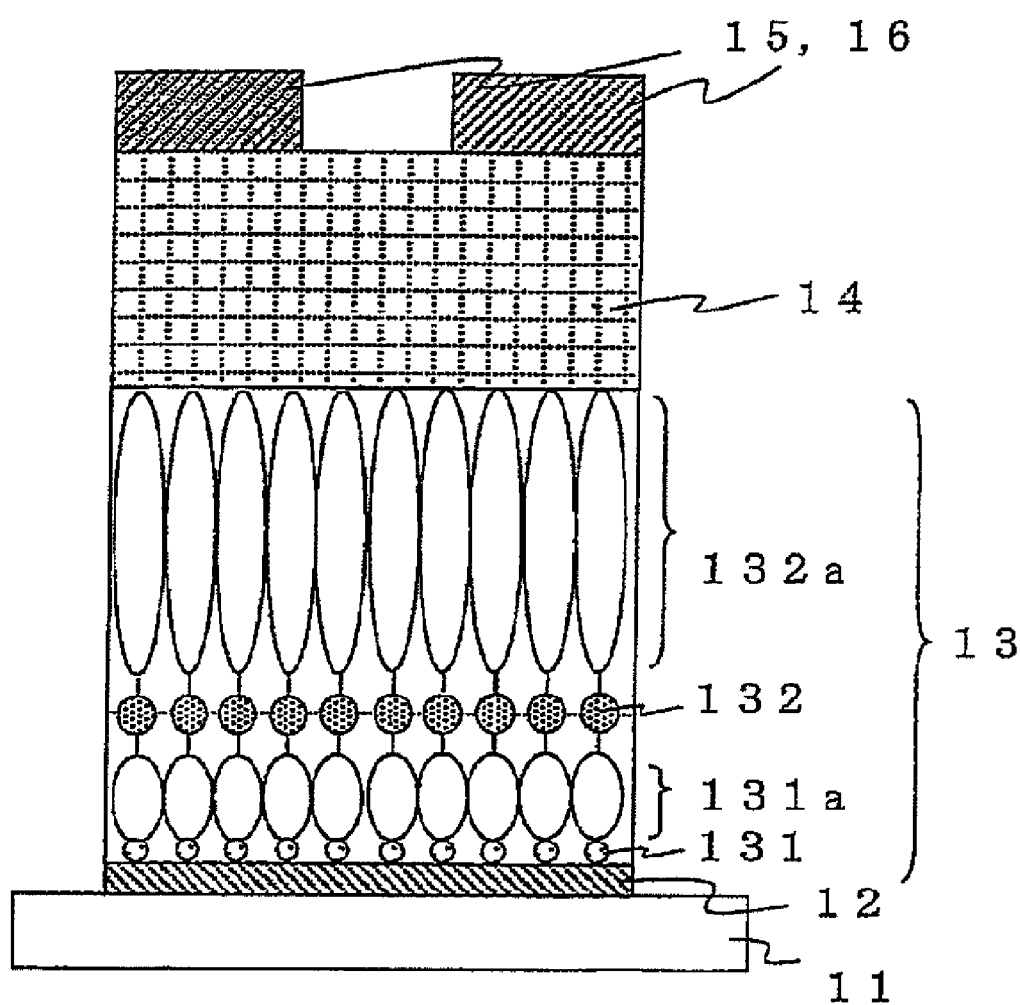
FIG. 1 is a schematic view of an organic transistor of the present invention.

| DESCRIPTION OF THE REFERENCE NUMERALS | |
|---|---|
| 11 | Substrate |
| 12 | Gate electrode |
| 13 | Gate insulating layer |
| 131 | First covalent bond |
| 131a | First organic molecular layer |
| 132 | Second covalent bond |
| 132a | Second organic molecular layer |
| 14 | Organic semiconductor layer |
| 15, 16 | Source, drain electrodes |
| 21 | Substrate |
| 22 | Gate electrode |
| 23 | Gate insulating layer |
| 231 | First covalent bond |
| 231a | First organic molecular layer |
| 232 | Second covalent bond |
| 232a | Second organic molecular layer |
| 24 | Organic semiconductor layer |
| 25, 26 | Source, drain electrodes |
| 31 | Substrate |
| 32 | Gate electrode |
| 33 | Gate insulating layer |
| 331 | First covalent bond |
| 331a | First organic molecular layer |
| 332 | Second covalent bond |
| 332a | Second organic molecular layer |
| 34 | Organic semiconductor layer |
| 35, 36 | Source, drain electrodes |
| 41 | Substrate |
| 42 | Gate electrode |
| 43 | Gate insulating layer |
| 431 | First covalent bond |
| 431a | First organic molecular layer |
| 432 | Second covalent bond |
| 432a | Second organic molecular layer |
| 44 | Organic semiconductor layer |
| 45, 46 | Source, drain electrodes |
| 51 | Substrate |
| 52 | Gate electrode |
| 53 | Gate insulating layer |
| 531 | First covalent bond |
| 531a | First organic molecular layer |
| 532 | Second covalent bond |
| 532a | Second organic molecular layer |
| 532b | Second organic molecular layer (second level) |
| 532z | Last end molecular layer |
| 54 | Organic semiconductor layer |
| 55, 56 | Source, drain electrodes |

BEST MODE FOR CARRYING OUT THE INVENTION

Structures, materials and production methods of the organic transistor of the present invention will be described with reference to FIGS. 1 to 5.

First, the structures will be described.

FIG. 1 is a schematic drawing of the structure of the organic transistor of the present invention. The organic transistor of the present invention has a substrate 11, a gate electrode 12, a gate insulating layer 13 formed of a stacked molecular film composed of a first organic molecular layer and a second organic molecular layer, an organic semiconductor layer 14, and source/drain electrodes 15, 16 in this order.

However, an organic transistor in which the organic semiconductor layer 14 and the source/drain electrodes 15, 16 are stacked in an order reverse from the above-described order also constitutes a part of the present invention.

That is, the transistor may be of a bottom contact type, though FIG. 1 discloses a transistor of a top contact type.

More specifically, the stacked molecular film comprises, on a surface of the gate electrode, a first organic molecular layer 131a binding in a direction substantially perpendicular to the surface of the gate electrode through a first covalent bond 131 and a second organic molecular layer 132a binding to a terminal functional group of the first organic molecular layer 131a through a second covalent bond 132. In addition, the second organic molecular layer 132a may be stacked into two or more layers between the other end thereof and one end of another organic molecular layer through the second covalent bond.

Here, the term "direction substantially perpendicular" used in the present invention means a direction in a range of 45° to 135° degrees, preferably a range of 60° to 120° with respect to the surface of the electrode.

With the above-described structure, second covalent bonds adjacent to each other in the direction of the plane perpendicular to the major axis direction of the molecule form a hydrogen bond. Therefore, the interaction among molecules is strengthened so that the interaction between adjacent molecules is stronger, making formation of pinholes more unlikely.

In addition, a structure including two or more layers consisting of second organic molecular layers formed through the second covalent bonds is preferable. With this structure, the area of the hydrogen bond formed between the adjacent second covalent bonds is increased, allowing further reduction of pinholes.

Next, the materials for composing the organic transistor according to the present invention will be described.

Substrate

The material suitable for the substrate 11 preferably has higher transparency, considering application to displays, and specific examples thereof include glass, quartz, and the like.

Furthermore, substrates of plastics such as acrylic resin, polyethylen sulfone resin, polyimide resin, polyethylenenaphthalate, polyethylene terephthalate are also preferable, considering application to flexible devices.

Gate Electrode

The material suitable for the gate electrode 12 preferably has a functional group for the stacked molecular film to form the first covalent bond.

Specifically, materials having a hydroxy group exposed on the surface thereof is preferable, including metals and semiconductor materials that allow formation of a natural oxide such as conductive inorganic oxide or a natural oxide film such as such as aluminum, titanium, tantalum, and low resistance silicon; and conductive inorganic oxied metals such as ITO (indium tin oxide), IZO (indium zinc oxide), and the like.

Other than those described above, specific examples include gold, silver, platinum, and the like, because it is also preferable that a sulfur atom and the surface of the metal as the material of the gate electrode form the first covalent bond therebetween.

Gate Insulating Layer

The gate insulating layer in the present invention is characterized in that it comprises a first covalent bond, a first organic molecular layer, a second covalent bond, and at least one second organic molecular layer.

In addition, the gate insulating layer in the present invention is characterized in that when two or more second organic molecular layers are stacked, the second organic molecular layers are stacked through the second covalent bond.

Next, will be described a pattern of the covalent bond, a functional group and a backbone of the molecular layer suitable for the stacked molecular film for forming the gate insulating layer 13.
(First Covalent Bond)

First, the first covalent bond 131 will be described.

As the first covalent bond, a siloxane bond and a phosphate bond are preferable, when the gate electrode has a hydroxy group in the surface thereof.

In addition, as the functional group for the formation of the bond between the surface of the gate electrode and the first organic molecular layer, a chlorosilyl group, a methoxysilyl group, or an ethoxysilyl group is preferable in the case of the formation of the siloxane bond, and a phosphonyl group is preferable in the case of the formation of the phosphate bond.

Furthermore, the functional group is preferably trifunctional (for example, a trichlorosilyl group, a trimethoxysilyl group, and a triethoxysilyl group). In this case, first covalent bonds adjacent to each other in the direction of the plane perpendicular to the stacking direction of the first organic molecular layer that is stacked through the first covalent bond, that is, the siloxane bond are crosslinked by the siloxane bond, thereby strengthening the interaction between adjacent molecules.

In addition, it is also preferable that the metal of the surface of the gate electrode and a sulfur atom form the first covalent bond. In this case, a step of introducing a hydroxy group (preparation of an oxide film) or the like can be omitted.

Examples of the functional group for the formation of the bond between the surface of the gate electrode and the first organic molecular layer include a thiol group and a dithiol group.
(First Organic Molecular Layer)

Next, the first organic molecular layer 131a will be described.

First, the structure of the organic molecule that forms the first organic molecular layer is required to have a functional group for forming, on the surface of the gate electrode, the first covalent bond with one terminal of the first organic molecule; and a functional group for forming, at the other terminal of the first organic molecule, the second covalent bond with one terminal of the second organic molecule.

One terminal of the first organic molecule and the surface of the gate electrode form the first covalent bond to form a stacked film composed of the first organic molecular layer on the surface of the gate electrode.

Particular examples of the functional group of the first organic molecule for forming the first covalent bond include a trimethoxysilyl group and a triethoxysilyl group, which do not generate hydrochloric acid during reaction.

And, examples of the functional group of the first organic molecule for forming the second covalent bond include an amino group, a carboxy group, and the like.

In addition, the backbone of the first organic molecular layer is preferably an aromatic backbone or an alkane backbone.

Specific examples of the aromatic backbone include a benzene backbone and a pyridine backbone. The aromatic backbone constitutes an upright molecular structure to allow stacking of the molecular layer in the direction substantially perpendicular to the surface of the gate electrode, and the benzene backbone is preferable from the viewpoint of stability and the like during reaction.

Examples of the alkane backbone include $C_{3-18}$ alkane backbones. Specific examples thereof include straight alkane backbones such as a propane ($C_3$) backbone, an undecane ($C_{11}$) backbone, and an octadecane ($C_{18}$) backbone. The alkane backbone allows arrangement of molecules including a sigma bond in the vicinity of the gate electrode, thereby allowing improvement of the insulating property.

In addition, it is preferable that the functional group for forming the first covalent bond and the functional group for forming the second covalent bond are located in separate positions in each molecular backbone, that is, in the positions 1 and 4 in the case of the benzene backbone, and in the positions α and ω in the case of the straight alkane backbone. In this case, the second organic molecular layer can be stacked in the direction substantially perpendicular to the gate electrode.
(Second Covalent Bond)

Next, the second covalent bond 132 will be described.

It is preferable that the second covalent bond is selected from an amide bond, an urea bond, and an urethane bond. Being these bonds, second covalent bonds adjacent to each other form a hydrogen bond therebetween on the surface perpendicular to the major axis direction of the molecule so that the interaction between molecules is strengthened and pinholes are unlikely to form in the gate insulating layer.

The second covalent bond is to be formed of an amino group and a carboxy group in the case of the amide bond, an amino group and an isocyanate group in the case of the urea bond, or a hydroxy group and an isocyanate group in the case of the urethane bond.

In addition, in the case of the structure in which the stacked molecular film includes two or more second organic molecular layers, all the second covalent bonds between the second organic molecular layers do not need to be the same and can be arbitrarily selected.

However, the second covalent bond is preferably an amide bond from the viewpoint of stability of the bond.

When the second covalent bond is an amide bond, no by-product that has an adverse effect on the substrate, the gate electrode, and the stacked molecular film is generated in a reaction for forming the amide bond, and amide bonds as the second covalent bonds adjacent to each other form a hydrogen bond on the surface perpendicular to the stacking direction of the stacked film under a mild condition, thereby strengthening the interaction between molecules.

Examples of the method for confirming the formed hydrogen bond include a method in which presence or absence of the hydrogen bond is confirmed by measuring the stacked molecular film for the infrared absorption spectrum and observing a shift of the wave number by comparing a peak (for example, N—H stretching vibration and C=O stretching vibration) associated with the hydrogen bond of the second covalent bond with a state of no hydrogen bond (while in a dilute solution).
(Second Organic Molecular Layer)

Next, the second organic molecular layer 132a will be described.

First, the structure of the second organic molecule used for forming the second organic molecular layer is required to have a functional group for forming the second covalent bond at one terminal or at both terminals.

One terminal of the second organic molecular layer and the other terminal of the first organic molecular layer form the second covalent bond therebetween to form a stacked film composed of the first organic molecular layer and the second organic molecular layer on the surface of the gate electrode.

As the functional group of the second organic molecule for forming the second covalent bond, among the above-mentioned, a carboxy group or an amino group is suitably used from the viewpoint of easiness of handling and stability of the formed second covalent bond.

In addition, even when a further second organic molecule is stacked on the stacked second organic molecular layer through the second covalent bond, it is desirable that the functional group for forming the second covalent bond is selected from the above-mentioned functional groups.

In addition, it is preferable that the functional groups in each molecular backbone are located in separate positions, that is, in the positions α and ω in the case of straight alkane backbone. In this case, it is possible to obtain a stacked molecular film formed in the direction substantially perpendicular to the gate electrode.

Therefore, the second organic molecular layer is preferably composed of an alkane backbone having an alkane or an aromatic compound.

Further, the second organic molecular layer is preferably composed of a $C_{3-19}$ alkane backbone, and a sigma bond of the alkane backbone enables improvement of the insulating property in the major axis direction of the molecule.

Specific examples of the second organic molecular layer include $C_{3-19}$ straight alkane backbones such as a propane ($C_3$) backbone, an octane ($C_8$) backbone, an undecane ($C_{11}$) backbone, and an octadecane ($C_{18}$) backbone; and a 5-phenylpentane backbone.

The examples further include an ether backbone in which carbon atoms of a straight alkane are substituted with oxygen atoms, a backbone having a partially branched alkane as a main chain such as a 2-methyloctane backbone, and a backbone having an alkane provided with an aromatic compound such as a phenyl group at its terminal as a main chain.

In addition, examples of the alkane backbone having an aromatic compound include $C_{3-19}$ alkane backbones having a benzene backbone, and 5-phenylpentane is more preferable candidate.

When the alkane chain has 20 or more carbon atoms, the concentration of the hydrogen bond between the second covalent bonds in the stacked molecular film is lowered. As a result, the effect reduces. When the alkane chain has 2 or less carbon atoms, the number of stackings to reach a certain film thickness is increased. Therefore, the above-mentioned range is the most suitable.

In addition, in the case of the structure in which the stacked molecular film has two or more second organic molecular layers, all the molecular backbones in the second organic molecular layers do not need to be the same and can be arbitrarily selected.

Next, the surface terminal group at a side opposite to the gate electrode of the stacked molecular film will be described.

Regardless of whether the stacked molecular film has a structure having a single second organic molecular layer or a structure having two or more second organic molecular layers, it is preferable that the end of the stacked molecular film is selected from a phenyl group and a methyl group.

By terminating with a functional group that is nonreactive and has smaller surface tension such as a phenyl group and a methyl group, the surface energy in the surface of the insulating layer formed of the stacked molecular film is decreased, and when an organic semiconductor layer is formed on the surface of the insulating layer, the arrangement of the organic molecules that form the organic semiconductor layer contacting with the surface of the insulating layer is improved, allowing enhancement of the mobility (Jpn. J. Appl. Phys. Vol. 41 (2002) p.p. 2730-2734, Do-Hyun Kim et al.)

Further, specific examples of the preferable structure of the stacked molecular film include:

(1) a structure in which the first organic molecular layer is composed of an aromatic backbone, the second covalent bond is an amide bond, and the second organic molecular layer is composed of a long-chain alkyl backbone; and (2) a structure in which the first organic molecular layer is composed of an aromatic backbone, the second covalent bond is an amide bond, and the second organic molecular layer is composed of an alkyl backbone having a phenyl group at its end.

First, by using a molecule having an aromatic backbone and an amino group for the common first organic molecular layer, it is possible to obtain a first organic molecular layer having a higher molecular density in the film and higher flatness of the film composed of the first organic molecular layer in the direction of the surface parallel to the gate electrode. Because of the higher molecular density in the film, there are exist many crosslinkable second covalent bonds adjacent to each other on the plane perpendicular to the major axis of the molecule, and because of the higher flatness, the crosslinking extends without unconformity.

For example, when a surface of a silicon substrate and p-aminophenyltrimethoxysilane are reacted to form the first organic molecular layer, the film has a molecular density close to that in a hexagonal close-packed state and a surface roughness of Rrms (Roughness root mean square)=0.2 nm or less, showing higher flatness.

In addition, when the second organic molecular layer has a backbone having an alkane as a main chain as illustrate in FIG. 3c), alkyl chains are interlocked into an amorphous form, and therefore it is possible to obtain an insulating layer in which a stacked molecular film shows higher flatness in the direction of the surface parallel to the gate electrode.

For example, stearic acid was stacked through an amide bond onto the first organic molecular layer composed of a benzene backbone having an amino group in the p-position and formed on the silicon substrate, and an area of 1 μm×1 μm thereof was scanned by using an atomic force microscope named Nano Scope IIIa, manufactured by Veeco Instruments, in a tapping mode to show a surface roughness of Rrms=0.3 nm or less.

It is known that an insulating layer having higher flatness enhances the mobility of a semiconductor layer (Applied Physics Letters, Vol. 85 (2004) p.p. 4400-4402, P. Heremansr et al.)

In addition, when the second organic molecular layer is composed of an alkyl backbone having a phenyl group at an end opposite to the gate electrode as illustrated in FIG. 4c), it is possible to introduce a sigma bond in the major axis direction of the molecule of the main chain alkyl and a phenyl group to the surface of the molecular layer. Therefore, the gate insulating layer can have high insulating property, and the carrier mobility of the organic semiconductor layer can be improved because of π-π interaction with a π conjugated molecule of the organic semiconductor layer contacting with the phenyl group on the surface of the gate insulating layer.

Organic Semiconductor Layer

Next, as the organic semiconductor layer to be formed on the gate insulating layer, low molecular n conjugated compounds such as pentacene, fullerene 60, and copper phthalocyanine; and n conjugated polymers such as polyparaphenylene vinylene and polythiophene are preferable. Further, pentacene is preferable, because it has satisfactory properties of mobility and ON/OFF ratio.

Next, as the source/drain electrodes, metals having higher conductivity such as gold and aluminum are preferable. In addition, considering carrier injection to the organic semiconductor layer, metals (such as gold) having a work function lower than the highest occupied molecular orbital (HOMO) level of the molecule of the organic semiconductor layer are preferable in the case of p-type semiconductors, and metals (such as aluminum) having a work function higher than the lowest unoccupied molecular orbital (LUMO) level of the molecule of the organic semiconductor layer are preferable in the case of n-type semiconductors.

Method for Producing Organic transistor

Next, the method for producing the organic transistor according to the present invention will be described with reference to FIGS. 2a) to f).

First, a gate electrode 22 is formed on a substrate 21 by a known method such as, for example, sputtering, ion plating, and vacuum deposition as illustrated in FIG. 2a).

Next, a first organic molecular layer 231a is formed on the gate electrode 22 through a first covalent bond 231 as illustrated in FIG. 2b).

When the layer is formed through a bond with a hydroxy group of the surface of the gate electrode, UV ozone treatment or oxygen plasma treatment is applied to the surface of the gate electrode in advance.

When the layer is formed through a bond with a metal atom of the surface of the gate electrode, it is preferable to anneal the electrode material in order to ensure flatness.

Then, it is preferable that the organic molecule for forming the first organic molecular layer is vaporized or dissolved in a solvent and reacted with the surface of the gate electrode to form the first covalent bond.

When a molecule having a trialkoxysilyl group is used, for example, it is preferable to sufficiently prevent water (moisture) in a reaction vessel, because the alkoxysilyl group is prone to hydrolysis with water and self-polymerization.

Specifically, it is preferable to carry out enclosure of the vessel under a nitrogen atmosphere in the case of gas phase methods, and it is preferable to use an anhydrous solvent such as anhydrous toluene in the case of liquid phase methods.

Furthermore, gas phase methods are preferable, because polymers (including dimers and oligomers) generated through self-polymerization will be high boiling compounds in gas phase methods to reduce vapor pressure, allowing prevention of physical deposition to the gate electrode and formation of a uniform self-assembled monolayer.

Next, a second organic molecular layer 232a is formed through a second covalent bond 232 at an unreacted end of the first organic molecular layer 231a as illustrated in FIG. 2c).

The second covalent bond is formed by reacting the terminal functional group of the first organic molecular layer and a functional group of the organic molecule that is to form the second covalent bond in a liquid phase or a gas phase.

Specifically, when an amide bond is formed, it is preferable to condense an amino group and a carboxy group by dehydration with the use of a condensing agent such as N-(3-dimethylaminopropyl)-N'-ethylcarbodiimide hydrochloride (hereinafter, abbreviated as EDC) or dicyclohexylcarbodiimide (hereinafter, abbreviated as DCC) in a liquid phase.

EDC is preferably used when the organic molecule for forming the second organic molecular layer is soluble in a polar solvent such as water and dichloromethane, and DCC is preferably used when the organic molecule for forming the second organic molecular layer is soluble in a non polar solvent such as toluene and hexane. In addition, a method in which N-hydroxysuccinimide (hereinafter, abbreviated as NHS) is added to form the layer by an active ester process is also preferable. Further, it is also preferable to use carboxylic acid chloride or carboxylic acid anhydride, which has higher activity than the carboxyl group. In this case, an amide bond is formed without using a condensing agent to allow stacking by a gas phase reaction as well as a liquid phase reaction.

In addition, when a urea bond and a urethane bond are formed, it is preferable to contact an amino group or a hydroxy group with an isocyanate group in a gas phase or a liquid phase. Further, the reaction between a hydroxy group or an amino group and an isocyanate group is progressed through addition reaction, and therefore it is possible to obtain a stacked molecular film without generation of a by-product.

When a second organic molecular layer 232x is stacked into two or more layers (n layers) as illustrated in FIG. 2d), may be mentioned a technique in which a molecule having the same functional group at both terminals and a molecule having a functional group for forming the second covalent bond with the functional group at both terminals are alternately stacked; and a technique in which a molecule having a combination of functional groups for forming the second covalent bond at both terminals is prepared to be stacked after protecting a functional group at one end, and the protection is eliminated after the stacking.

Examples of the former include alternate stacking of a diamine molecule and a dicarboxylic acid molecule, a diamine molecule and a diisocyanate molecule, and a diol molecule and a diisocyanate molecule. Examples of the latter include a technique in which a molecule having a carboxy group and an amino group (amino acid) is prepared to be stacked through an amide bond with an amino group on the surface of the substrate after protecting the amino group of the molecule with a t-butoxycarbonyl group or the like, and then the protecting group is eliminated to cause regeneration of an amino group on the surface of the substrate.

Regardless of whether the second organic molecular layer is a single layer or stacked into two or more layers, it is preferable that a last end layer 232z of the stacked molecular film terminates with an organic molecule having one functional group.

As described above, a gate insulating layer 23 formed of a stacked molecular film in which a hydrogen bond is formed between second covalent bonds adjacent on the surface perpendicular to the major axis direction of the molecule is produced.

Next, a method for forming an organic semiconductor layer 24 on the gate insulating layer 23 as illustrated in FIG. 2e) will be described.

When being low molecular weight, the organic semiconductor material is preferably vacuum deposited. When the organic semiconductor material is soluble in a solvent, high molecular weight or low molecular weight, a liquid-phase process such as inkjet and a spin coat method is preferably used as allowing reduction of production costs and area enlargement.

Lastly, a method for forming source/drain electrodes 25, 26 on the organic semiconductor layer 24 as illustrated in FIG. 2f) will be described.

Generally, mask vapor deposition of a metal is preferable as being simple and easy, while a technique using inkjet with silver nanoparticles or a conductive polymer and a technique using electroless plating are preferable as allowing the electrodes to be formed by a liquid-phase process.

As described above, the organic transistor can be produced.

Figure 2:
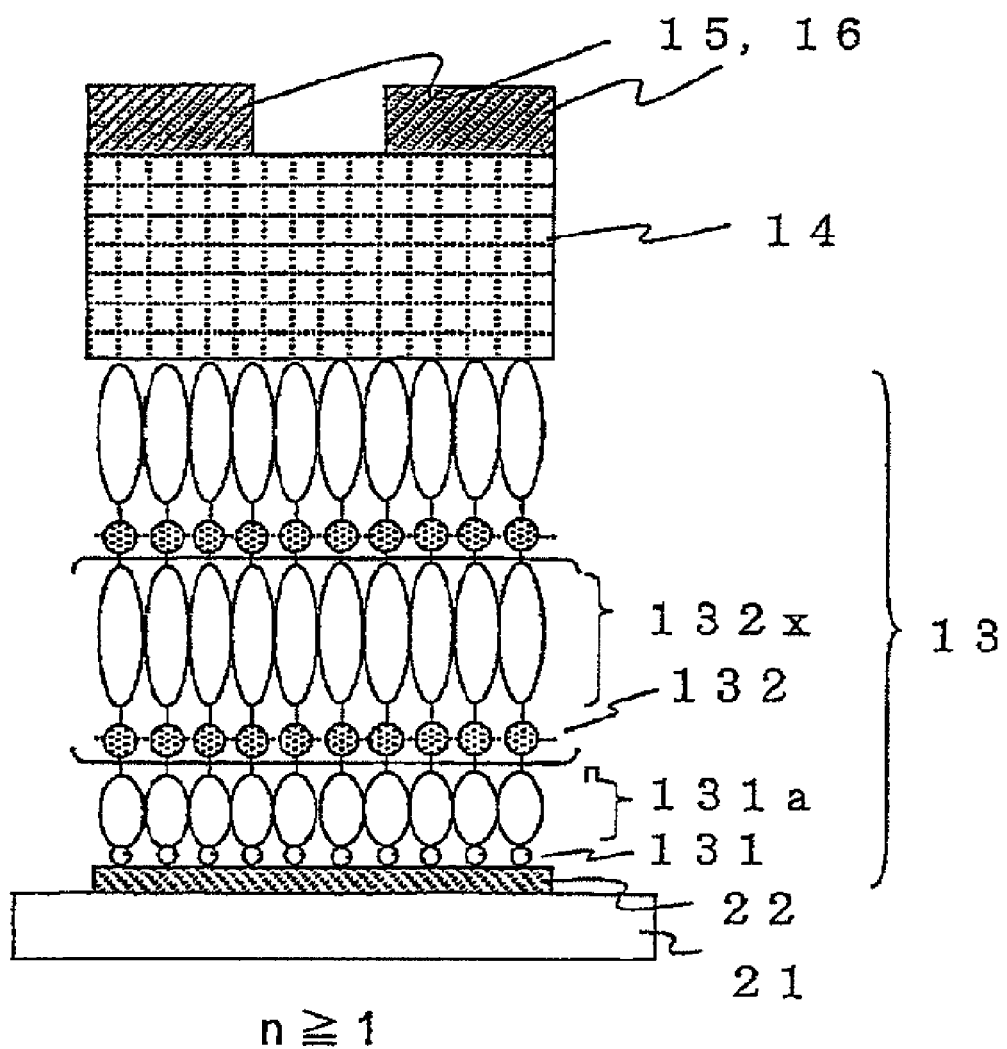
FIG. 2 is a schematic view illustrating steps of producing an organic transistor of the present invention.

When two or more second organic molecular layers are included as illustrated in FIG. 2 d), it is possible to produce an organic transistor having two or more second organic molecular layers by forming the organic semiconductor layer 14 and the source/drain electrodes 15, 16 on the gate insulating layer as illustrated in FIG. 2g) in the same manner as described above.

Here, when used as a pixel driver of a display, the organic transistor according to the present invention can be used for liquid crystal displays, organic electroluminescence displays, or electronic papers. When included in an IC chip, the organic transistor according to the present invention can be used for RF tags or the like.

EXAMPLES

The following examples are to illustrate the present invention in more detail, and are not intended to limit the present invention.

The Vg-Id characteristics of the transistors produced in the following examples were measured with the use of a semiconductor parameter analyzer B1500A manufactured by Agilent Technologies. Specifically, the Ig-Id characteristics were obtained from the semiconductor parameters, and then modified to a plot of Vg-(Id)$^{1/2}$ for calculation of the threshold voltage and the mobility. The mobility was calculated from a slope of a straight area of the plot.

The threshold voltage was calculated from a Vg value when Id=0.

For a saturation area in FET, the calculation was made in accordance with the following formula:

$$\sqrt{Id} = \sqrt{\left(\frac{W\mu Ci}{2L}\right)}(Vg - Vth) \quad \text{[Formula 3]}$$

wherein, Id is a drain current (A), W is a channel width (1 cm), L is a channel length (0.01 cm), μ is a mobility (cm$^2$/Vs), Ci is a capacitance (1×10$^{-6}$ F/cm) of the gate insulating layer, Vg is a gate voltage (V), and Vth is a threshold voltage (V).

The ON/OFF ratio was calculated according to (maximum Id value)/(minimum Id value) of the Vg-Id characteristics.

Furthermore, for the voltage resistance of the insulating layer, voltages of –2 V to 2 V were applied between an upper electrode and a lower electrode to obtain the current characteristic with respect to the voltages. Thereafter, the voltages were divided by the film thickness to carry out conversion into the electric field strength, and the currents were divided by the electrode area to carry out conversion into the current density to plot the current density characteristic with respect to the electric field strength. Based on the plot obtained, the voltage resistance was calculated as the electric field strength value when the current density reached 1 μA/cm$^2$.

Example 1

FIGS. 3a) to 3e) are drawings schematically illustrating a method for producing an organic transistor of the present invention.

First, 60 nm of aluminum was formed on a glass substrate 31 as a gate electrode 32 by vacuum deposition as illustrated in FIG. 3a). Next, the thus obtained was immersed in acetone to be delipidated by ultrasonic cleaning, and then a natural oxide film was formed on a surface of the aluminium formed into a film by oxygen plasma treatment, thereby exposing hydroxy groups on the surface.

Next, a first organic molecular layer 331a was formed through a first covalent bond 331 as illustrated in FIG. 3b). The substrate on which the electrode was formed and p-aminophenyltrimethoxysilane as an organic molecule for forming the first organic molecular layer were enclosed into a Teflon (registered trademark) vessel under a nitrogen atmosphere and heated in an oven at 100° C. for 120 minutes to form a first organic molecular layer having a phenyl backbone and an amino group through a siloxane bond.

Next, a second organic molecular layer 332a was stacked through a second covalent bond 332 as illustrated in FIG. 3c). The substrate on which the first organic molecular layer was formed was immersed in a methylene chloride solution (1 mmol/L) of stearic acid as an organic molecule for forming the second organic molecular layer, and EDC was further added thereto so that the concentration of the EDC would be 1 mmol/L and stirred at room temperature for 6 hours. Lastly, ultrasonic cleaning was carried out with chloroform to remove the stearic acid physically adsorbed on the substrate, thereby stacking the second organic molecular layer having a long-chain alkyl moiety and formed through an amide bond. Thus, a gate insulating layer 33 formed of a stacked molecular film in which a hydrogen bond is formed between amido bonds adjacent on the surface perpendicular to the major axis direction of the molecule was formed. The stacked molecular film was measured for the infrared absorption spectrum to observe a shift of absorption of the N—H stretching vibration to a low wave number side by approximately 200$^{-1}$ cm compared with the same absorption peak when measured in a dilute hexane solution of stearanilide. As a result, formation of the hydrogen bond between amide bonds adjacent to each other in the direction of the plane perpendicular to the major axis direction of the stacked molecule was confirmed.

Figure 3:
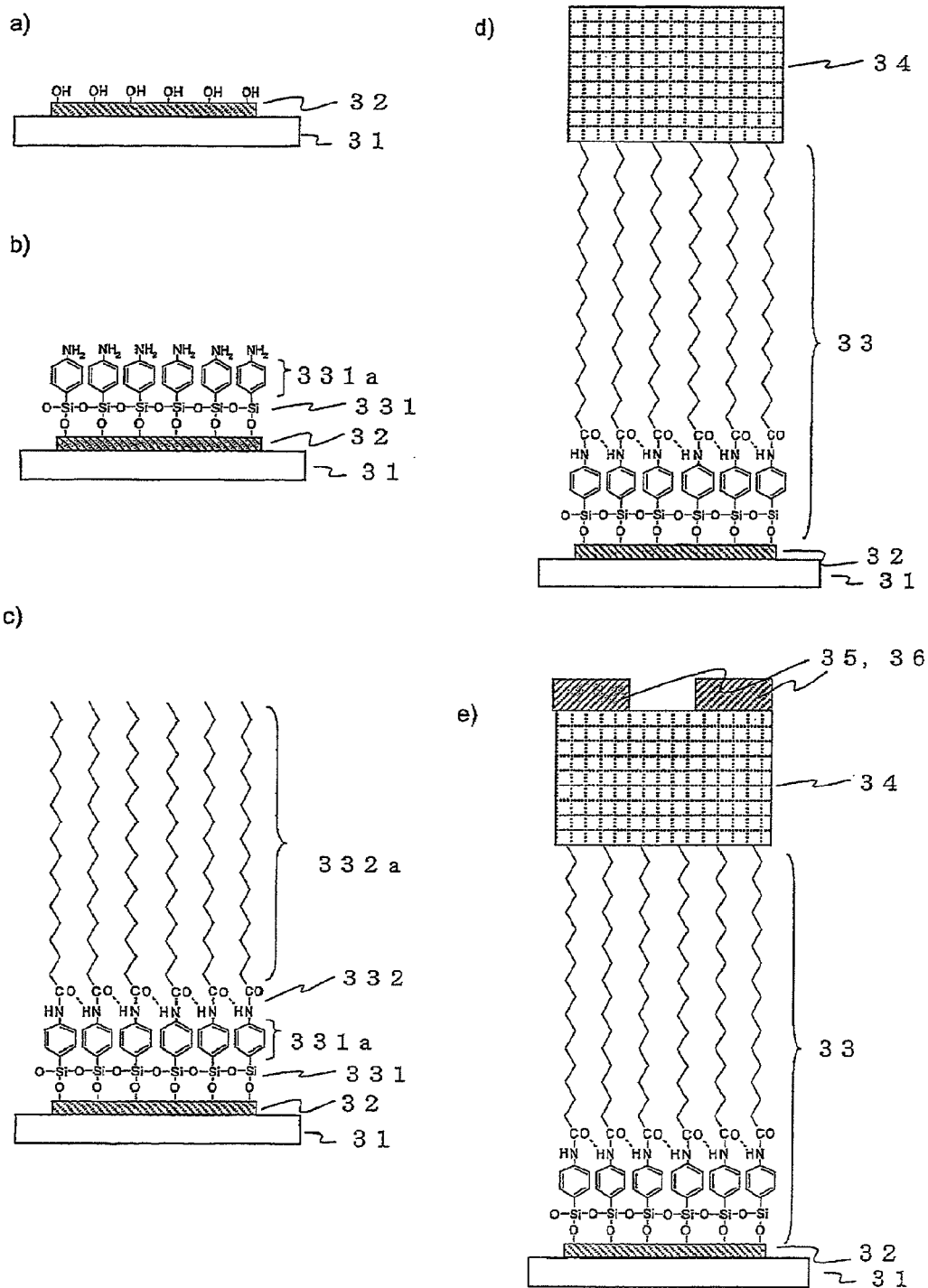
FIG. 3 is a schematic view illustrating steps of producing an organic transistor of the present invention.
Figure 4:
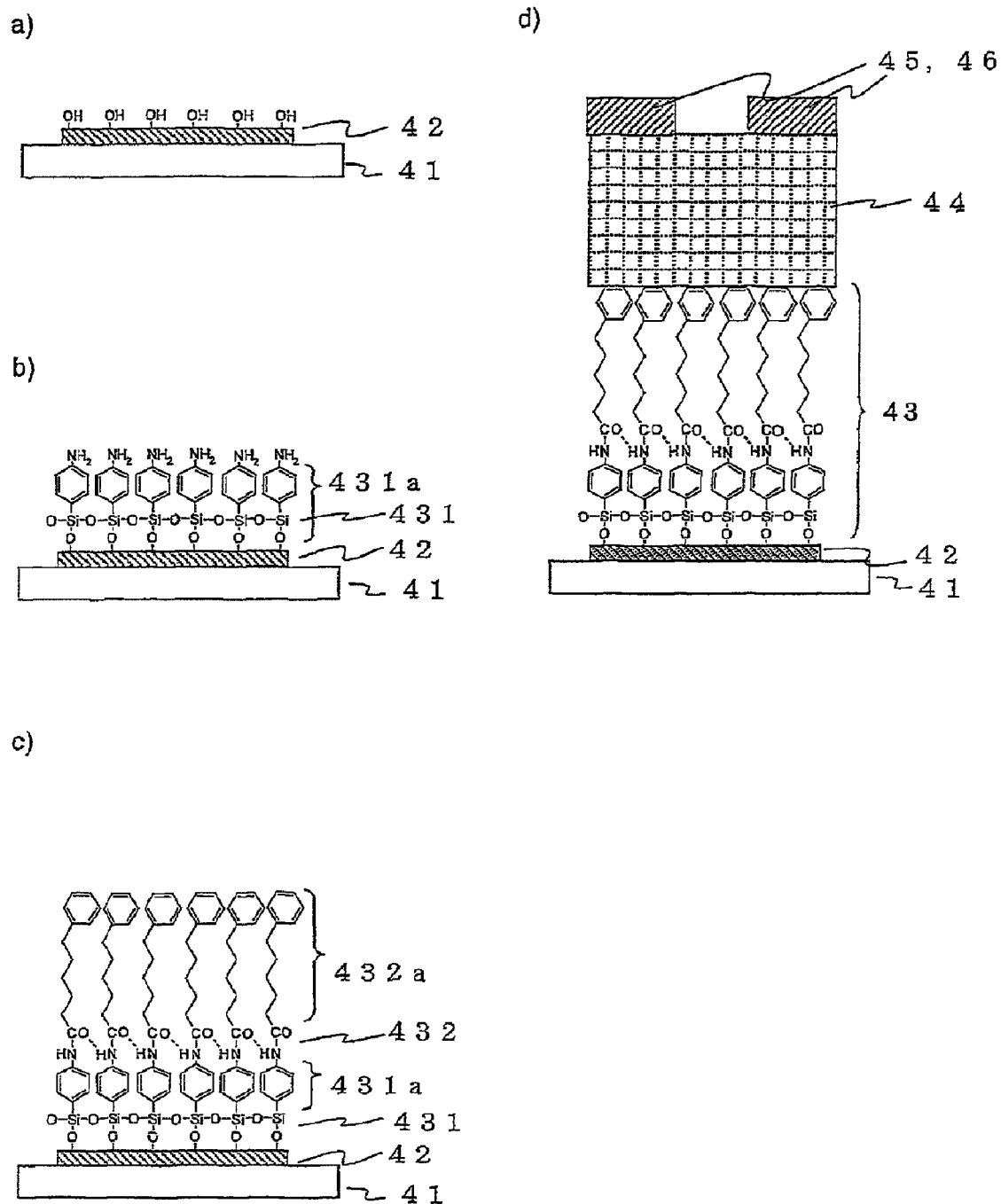
FIG. 4 is a schematic view illustrating steps of producing an organic transistor of the present invention.
Figure 5:
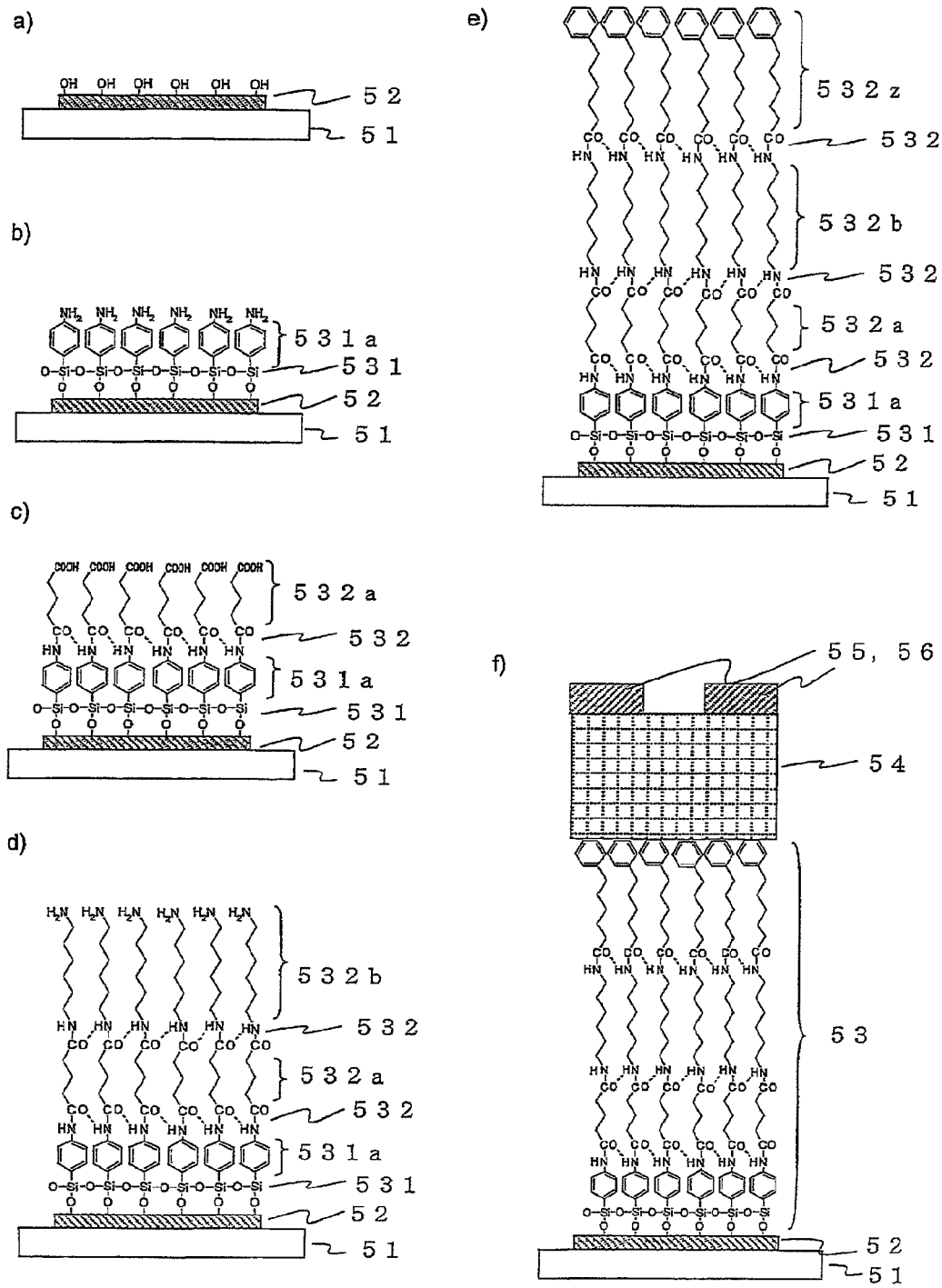
FIG. 5 is a schematic view illustrating steps of producing an organic transistor of the present invention.

Next, an organic semiconductor layer 34 was deposited on the gate insulating layer 33 as illustrated in FIG. 3 d). Specifically, 60 nm of pentacene was vacuum deposited at a deposition rate of 0.2 nm/s.

Next, source/drain electrodes 35, 36 were deposited on the organic semiconductor layer 34 as illustrated in FIG. 3e). Specifically, 60 nm of gold was vacuum deposited at a deposition rate of 0.2 nm/s.

As described above, a top contact type transistor was produced.

The gate electrode, the source electrode, and the drain electrode were probed for evaluation of the Vg-Id characteristics to indicate threshold voltage: –0.9 V, mobility: 0.9 cm$^2$/Vs, and ON/OFF ratio: 10$^6$, showing driving at a low threshold voltage by the thin gate insulating layer and channel modulation by application of a gate voltage. In addition, as a comparative example, a self-assembled monolayer composed of long-chain alkyl chains having no hydrogen bond formed was used as an insulating layer. In this case, sufficient insulating property was failed to be secured, a gate current was confirmed to flow to the source/drain electrodes, and no transistor operation was shown.

In addition, as evaluation of the insulating property of the stacked molecular film, the stacked molecular film was formed on a low resistance silicon substrate and a gold electrode (electrode area: 0.196 mm$^2$) was formed thereon to form a metal-insulating layer-inorganic semiconductor layer structure (MIS structure). Next, voltages of –2 V to 2 V were applied between both electrodes, that is, the gold as an upper electrode and the low resistance silicon substrate as a lower electrode, to give a voltage resistance of 9 MV/cm, which was obtained by converting a voltage when the current density reached 1 μA/cm$^2$. In addition, when the self-assembled monolayer composed of long-chain alkyl chains having no hydrogen bond formed was used as an insulating layer as a comparative example, the voltage resistance was as low as 3 MV/cm. That is to show the insulating layer formed of the stacked molecular film of the present invention is a gate insulating layer that is unlikely to cause pinholes to form and that has high insulating property.

Example 2

A gate electrode 42 and a first organic molecular layer 431a were formed on a glass substrate 41 as illustrated in FIGS. 4a) and b) in the same manner and using the same materials as in Example 1.

Next, a second organic molecular layer 432a was stacked on the first organic molecular layer 431a through a second covalent bond 432 as illustrated in FIG. 4c). Specifically, the substrate on which the first organic molecular layer was formed was immersed in 1 mmol/L of a methylene chloride solution of 6-phenylhexanoic acid as an organic molecule for forming the second organic molecular layer, and EDC was added thereto so that the concentration of the EDC would be 1 mmol/L and stirred at room temperature for 6 hours. Lastly, ultrasonic cleaning was carried out with chloroform to remove the 6-phenylhexanoic acid physically adsorbed on the substrate, thereby stacking an alkyl main chain formed through an amide bond and the second organic molecular layer having a phenyl group at an end opposite to a gate insulating layer to produce a gate insulating layer 43 formed of a stacked molecular film. The stacked molecular film was measured for the infrared absorption spectrum to observe a shift of absorption of the N-H stretching vibration to a low wave number side compared with the absorption peak when measured in a dilute hexane solution as in the case of Example 1. As a result, formation of a hydrogen bond between amide bonds adjacent to each other in the direction of the plane perpendicular to the major axis direction of the stacked molecule was confirmed.

Next, an organic semiconductor layer 44 and source/drain electrodes 45, 46 were formed on the gate insulating layer 43 as illustrated in FIG. 4d) in the same manner and using the same materials as in Example 1 to produce a top contact type transistor.

The Vg-Id characteristics were evaluated as in the case of Example 1 to indicate threshold voltage: $-0.9$ V, mobility: 1.1 $cm^2/Vs$, and ON/OFF ratio: $10^6$, showing driving at a low threshold voltage by the thin gate insulating layer and channel modulation by application of a gate voltage. In addition, since a phenyl group composes an end to produce n-n interaction with pentacene of the organic semiconductor layer, the arrangement of the molecules of the organic semiconductor layer was improved and higher mobility was shown compared with Example 1 in which a methyl group composes an end.

In addition, as evaluation of the insulating property of the stacked molecular film, the same MIS structure as in Example 1 was formed to be evaluated in the same manner to indicate a voltage resistance of the insulating layer at 1 $\mu A/cm^2$ of 9 MV/cm, showing higher insulating property.

This result indicates that the insulating layer of the present invention is a gate insulating layer that is unlikely to cause pinholes to form and that has high insulating property.

Example 3

A first organic molecular layer 531a was formed on a gate electrode 52 on a glass substrate 51 through a first covalent bond 531 as illustrated in FIGS. 5a) and b) in the same manner and using the same materials as in Example 1.

Next, a second organic molecular layer 532a was stacked on the first organic molecular layer 531a through a second covalent bond 532 as illustrated in FIG. 5c). Specifically, the substrate on which the first organic molecular layer was formed was immersed in 1 mmol/L of an aqueous solution of glutaric acid, which is a bifunctional carboxylic acid as an organic molecule for forming the second organic molecular layer, and EDC was added thereto so that the concentration of the EDC would be 1 mmol/L and stirred at room temperature for 1 hour.

Next, a second organic molecular layer 532b was stacked on the second organic molecular layer 532a through the second covalent bond 532 as illustrated in FIG. 5d). Specifically, the substrate on which the second organic molecular layer 532a was formed was immersed in 1 mmol/L of an aqueous solution of hexamethylenediamine, which is a bifunctional amine as an organic molecule for forming the second organic molecular layer, and EDC was added thereto so that the concentration of the EDC would be 1 mmol/L and stirred at room temperature for 1 hour.

Next, a last end molecular layer 532z was stacked on the second organic molecular layer 532b through the second covalent bond 532 as illustrated in FIG. 5e). As an organic molecule for forming the last end molecular layer, 6-phenylhexanoic acid was stacked under the same condition as in Example 2 to produce a gate insulating layer 53 formed of a stacked molecular film including two places of amide bonds in a molecular chain. The stacked molecular film was measured for the infrared absorption spectrum to observe a shift of absorption of the N—H stretching vibration to a low wave number side compared with the absorption peak when measured in a dilute hexane solution as in the case of Example 1. As a result, formation of a hydrogen bond between amide bonds adjacent to each other in the direction of the plane perpendicular to the major axis direction of the stacked molecule was confirmed.

Next, an organic semiconductor layer 54, a gate electrode 55, and a source electrode 56 were formed on the gate insulating layer 53 as illustrated in FIG. 5f) in the same manner and using the same materials as in Example 1 to produce a top contact type transistor.

The Vg-Id characteristics were evaluated as in the case of Example 1 to indicate threshold voltage: $-0.9$ V, mobility: 1.0 $cm^2/Vs$, and ON/OFF ratio: $10^6$, showing driving at a low threshold voltage by the thin gate insulating layer and channel modulation by application of a gate voltage.

In addition, as evaluation of the insulating property of the stacked molecular film, the same MIS structure as in Example 1 was formed to be evaluated in the same manner to indicate a voltage resistance of the insulating layer at 1 $\mu A/cm^2$ of 10 MV/cm, showing higher insulating property compared with Examples 1 and 2. This is considered because pinholes further decrease due to increase in the area where the hydrogen bond is formed.

This result also indicates that the insulating layer of the present invention is a gate insulating layer that is unlikely to cause pinholes to form and that has high insulating property Industrial Applicability According to the structure of the organic transistor of the present invention and the method for producing the same, the second covalent bond and another second covalent bond adjacent to each other form a hydrogen bond in a direction of a plane perpendicular to the major axis direction of the molecule, that is, a direction approximately parallel to a surface of the gate electrode, thereby allowing production of a gate insulating layer under a mild condition, in which the interaction between neighboring molecules is strengthened and pinholes are unlikely to form.

The invention claimed is:

1. An organic transistor comprising:
    at least a gate electrode and a gate insulating layer formed on the gate electrode,
    the gate insulating layer including, on a surface of the gate electrode, a stacked molecular film composed of
    a first organic molecular layer binding in a direction substantially perpendicular to the surface of the gate electrode through a first covalent bond with one end of a first organic molecule and
    a second organic molecular layer binding to another end of the first organic molecular layer through a second covalent bond with one end of a second organic molecule, wherein
    the second covalent bond and another second covalent bond adjacent to each other form a hydrogen bond in a direction of a surface perpendicular to a stacking direction of the stacked molecular film.

2. The organic transistor according to claim 1, wherein the second organic molecular layer is stacked into two or more layers between another end thereof and one end of another second organic molecular layer through the second covalent bond.

3. The organic transistor according to claim 1, wherein the first organic molecular layer is composed of an aromatic backbone.

4. The organic transistor according to claim 1, wherein the first organic molecular layer is composed of a benzene backbone.

5. The organic transistor according to claim 1, wherein the first organic molecular layer is composed of a benzene backbone, and the benzene backbone has the first covalent bond and the second covalent bond in positions 1 and 4.

6. The organic transistor according to claim 1, wherein the second organic molecular layer is composed of a $C_{3-19}$ alkane backbone or a $C_{3-19}$ alkane backbone having a benzene backbone.

7. The organic transistor according to claim 1, wherein the second organic molecular layer is composed of a backbone selected from the group consisting of propane, hexane, heptadecane, and 5-phenylpentane backbones.

8. The organic transistor according to claim 1, wherein the first covalent bond is a siloxane bond, the first organic molecular layer is composed of a benzene backbone, the second covalent bond is an amide bond, and the second organic molecular layer is composed of a backbone selected from the group consisting of propane, hexane, heptadecane, and 5-phenylpentane backbones.

9. The organic transistor according to claim 1, wherein an end at a side opposite to the gate electrode of the stacked molecular film is a phenyl group or a methyl group.

10. A method for producing an organic transistor, the method comprising:
    a first step of forming a first organic molecular layer on a surface of a gate electrode in a direction substantially perpendicular to the surface of the gate electrode through a first covalent bond with one end of a first organic molecule;
    a second step of forming a second organic molecular layer at another end of the first organic molecular layer through a second covalent bond with one end of a second organic molecule, and forming a gate insulating layer formed of a stacked molecular film composed of the first organic molecular layer and the second organic molecular layer; and
    a third step of causing the second covalent bond and another second covalent bond adjacent to each other to form a hydrogen bond in a direction of a surface perpendicular to a stacking direction of the stacked molecular film.

11. The method for producing an organic transistor according to claim 10, wherein a step of further stacking, on another end of the second organic molecular film, a second organic molecular layer through the second covalent bond with the other end of the second organic molecular layer is repeated at least one time in the second step.

12. The method for producing an organic transistor according to claim 10, wherein the second covalent bond is formed through a reaction in any of the combinations of an amino group and a carboxy group, an amino group and an isocyanate group, and a hydroxy group and an isocyanate group.

* * * * *